US007256406B2

United States Patent
Yoo et al.

(10) Patent No.: US 7,256,406 B2
(45) Date of Patent: Aug. 14, 2007

(54) EMITTER FOR ELECTRON-BEAM PROJECTION LITHOGRAPHY SYSTEM, AND METHOD OF MANUFACTURING AND OPERATING THE EMITTER

(75) Inventors: In-kyeong Yoo, Suwon-si (KR); Chang-wook Moon, Seoul (KR); Chang-hoon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 10/962,467

(22) Filed: Oct. 13, 2004

(65) Prior Publication Data
US 2005/0077833 A1    Apr. 14, 2005

(30) Foreign Application Priority Data
Oct. 13, 2003   (KR) .................. 10-2003-0070990

(51) Int. Cl.
*G21K 5/10*    (2006.01)
(52) U.S. Cl. ..................... 250/492.24; 315/111.81; 445/50
(58) Field of Classification Search ............ 250/492.24
See application file for complete search history.

(56) References Cited

U.S. PATENT DOCUMENTS

| 3,843,916 | A | * | 10/1974 | Trotel et al. ................. 318/640 |
| 4,906,894 | A | * | 3/1990 | Miyawaki et al. ............ 313/542 |
| 4,954,717 | A | * | 9/1990 | Sakamoto et al. ......... 250/492.3 |
| 7,025,892 | B1 | * | 4/2006 | Bergeron et al. ............. 216/13 |
| 2006/0127800 | A1 | * | 6/2006 | Huang et al. ............. 430/270.1 |

* cited by examiner

*Primary Examiner*—Jack I. Berman
*Assistant Examiner*—Phillip A Johnston
(74) *Attorney, Agent, or Firm*—Lee & Morse, P.C.

(57) ABSTRACT

An emitter for an electron-beam projection lithography system includes a photoconductor substrate, an insulating layer formed on a front surface of the photoconductor substrate, a gate electrode layer formed on the insulating layer, and a base electrode layer formed on a rear surface of the photoconductor substrate and formed of a transparent conductive material. In operation of the emitter, a voltage is applied between the base electrode and the gate electrode layer, light is projected onto a portion of the photoconductor substrate to convert the portion of the photoconductor substrate into a conductor such that electrons are emitted only from the partial portion where the light is projected. Since the emitter can partially emit electrons, partial correcting, patterning or repairing of a subject electron-resist can be realized.

16 Claims, 4 Drawing Sheets

EMITTER FOR ELECTRON-BEAM PROJECTION LITHOGRAPHY SYSTEM, AND METHOD OF MANUFACTURING AND OPERATING THE EMITTER

BACKGROUND OF THE INVENTION

1. Field of the Invention

The present invention relates to an electron-beam projection lithography system. More particularly, the present invention relates to an emitter for an electron-beam projection lithography system, the emitter being capable of emitting electrons only from a selected portion thereof, a manufacturing method thereof, and a method of operating the emitter.

2. Description of the Related Art

In semiconductor manufacturing processes, a variety of lithography systems are used for processing a surface of a substrate into a desired pattern. Optical lithography systems using visible light have been widely employed, but these systems are limited in how narrow a line width they can realize. Accordingly, a next generation lithography (NGL) system, which allows a more finely integrated semiconductor integration circuit with a line width of on the order of nanometers to be realized, has been recently proposed. The NGL system can be divided into an electron-beam projection lithography (EPL) system, an ion projection lithography (IPL) system, an extreme ultraviolet lithography (EUVL) system, a proximity X-ray lithography (PXL) system, as well as others.

The EPL system uses an electron-beam to pattern an electron-resist coated on a subject substrate. An electron beam emitter used in the EPL system can be easily realized, and the construction of the emitter is relatively simple.

In FIG. 1, a cross-sectional view of a conventional electron-beam projection lithography emitter is illustrated. Referring to FIG. 1, an electron-beam projection lithography emitter 10 has a structure where an insulating layer 12 and a gate electrode layer 13 are sequentially stacked on a silicon substrate 11. The insulating layer 12 is formed of a silicon oxide film, and the gate electrode layer 13 is formed of a conductive metal such as aluminum (Al).

The insulating layer 12 of the emitter 10 is patterned into a predetermined pattern including a thin portion and a thick portion. When a voltage is applied between the silicon substrate 11 and the gate electrode layer 13, electrons are emitted through the thin portion of the insulating layer 12 from the silicon substrate 11. The emitted electrons collide with an electron-resist coated on an object substrate to be processed (not shown), facing a top surface of the emitter 10. As a result, the electron-resist is patterned in the same pattern as that of the insulating layer 12.

As described above, since the electrons are emitted through an entire area, the pattern image formed on the emitter 10 is projected onto the object substrate to be processed. Then, after the first patterning throughout the entire area, there may be a need to repair or further pattern a portion of the patterned electron-resist. However, the conventional emitter 10 does not permit such partial electron emission.

SUMMARY OF THE INVENTION

The present invention is therefore directed to an electron-beam emitter, method of making the electron-beam emitter, and method of using the electron-beam emitter, which substantially overcome one or more of the problems due to the limitations and disadvantages of the related art.

It is a feature of an embodiment of the present invention to provide an emitter for an electron-beam projection lithography system capable of partial electron emission.

It is another feature of an embodiment of the present invention to provide an emitter capable of partial electron emission for a partial correction or repair after an allover first patterning.

It is still another feature of an embodiment of the present invention to provide a method of operating an emitter for an electron-beam projection lithography system using partial electron emission.

It is yet another feature of an embodiment of the present invention to provide a method of manufacturing the emitter capable of partial electron emission for an electron-beam projection lithography system.

At least one of the above and other features and advantages of the present invention may be realized by providing an emitter for an electron-beam projection lithography system, which includes a photoconductor substrate, an insulating layer formed on a front surface of the photoconductor substrate, a gate electrode layer formed on the insulating layer, and a base electrode layer formed on a rear surface of the photoconductor substrate and formed of a transparent conductive material.

The gate electrode layer may include relatively thick and thin portions. The photoconductor substrate may include at least one of a gallium arsenide (GaAs) substrate or an amorphous silicon substrate. The insulating layer may be formed of an anodized metal, e.g., anodized alumina. The gate electrode layer may be formed of a metal selected from the group of gold (Au), palladium (Pd), titanium (Ti) and aluminum (Al). The base electrode layer may be formed of indium tin oxide.

At least one of the above and other features and advantages of the present invention may be realized by providing a method of operating the above emitter including applying a voltage between the base electrode and the gate electrode layer, and projecting light onto a portion of the photoconductor substrate from the rear side of the emitter to convert a part of the photoconductor substrate into a conductor such that electrons are emitted only from the portion where the light is projected.

The light may be from an ultraviolet light source or a laser. The light may be projected onto an entire surface of the substrate, e.g., before projecting light onto the portion of the substrate. The portion may include more than one non-adjacent portion. At least one of an intensity and a wavelength of the light may be varied.

At least one of the above and other features and advantages of the present invention may be realized by providing a method of manufacturing an emitter for an electron-beam projection lithography system, the method including preparing a photoconductor substrate, forming a base electrode layer on a rear surface of the photoconductor substrate, the base electrode layer being transparent, forming an insulating layer on a front surface of the photoconductor substrate, and forming a gate electrode layer by depositing a conductive material on the insulating layer.

The forming the base electrode layer may be performed after the forming the gate electrode layer. The photoconductor substrate may be at least one of a gallium arsenide (GaAs) substrate or an amorphous silicon substrate. The base electrode layer may be formed of indium tin oxide. The gate electrode layer may be formed of a metal selected from the group of gold (Au), palladium (Pd), titanium (Ti) and aluminum (Al).

The forming the insulating layer may include depositing an anodizable metal, e.g., aluminum, on an entire surface of the photoconductor substrate, and anodizing the deposited metal, e.g., to form alumina.

Forming the gate electrode layer may further include patterning the deposited conductive metal so as to have a thin portion and a thick portion relative to the thin portion. The patterning may include depositing a first conductive material on the insulating layer to form a first conductor layer, patterning the first conductor layer to form a predetermined conductor layer pattern, and depositing a second conductive material on the first conductor layer and the insulating layer exposed by the patterning step to form a second conductor layer. The patterning the first conductor layer may include coating a resist on an upper surface of the first conductor layer, patterning the coated resist, selectively etching the first conductor layer by using the patterned resist as an etch mask, and removing the resist.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
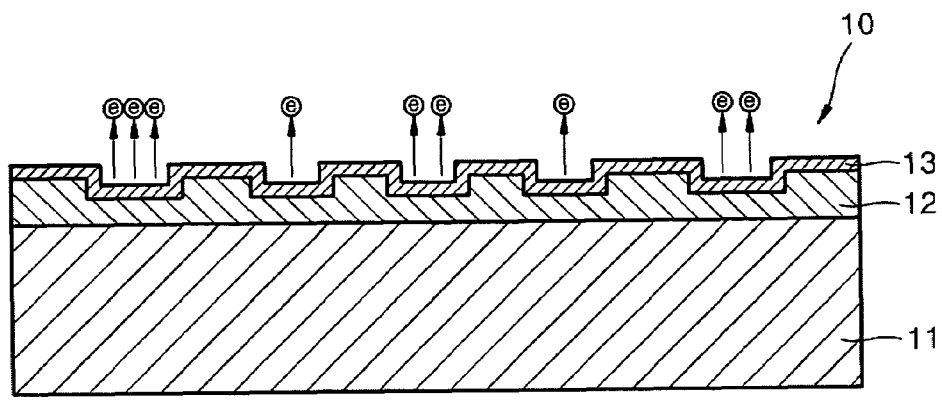
FIG. 1 illustrates a cross-sectional view of an example of a conventional emitter for an electron-beam projection lithography system.

Korean Patent Application No. 2003-70990, filed on Oct. 13, 2003, in the Korean Intellectual Property Office, and entitled: "Emitter for Electron-beam Projection Lithography, operating method and manufacturing Method thereof," is incorporated by reference herein in its entirety.

The present invention will now be described more fully with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
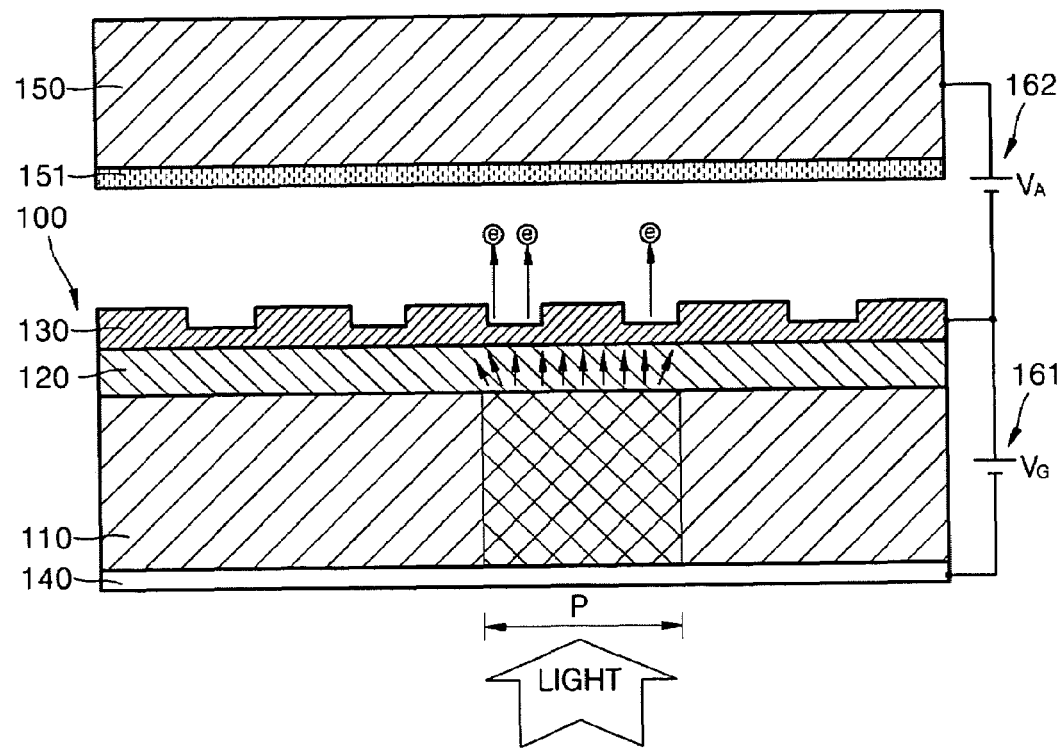
FIG. 2 illustrates a cross-sectional view of an emitter structure for an electron-beam projection lithography system and a method of operating the same according to an embodiment of the present invention.

FIG. 2 illustrates a cross-sectional view of an emitter structure for electron-beam projection lithography and a method of operating the same according to an embodiment of the present invention.

Referring to FIG. 2, an emitter 100 for an electron-beam projection lithography system according to the present invention includes a photoconductor substrate 110, an insulating layer 120 formed on a front surface of the photoconductor substrate 110, a gate electrode layer 130 formed on the insulating layer 120, and a base electrode layer 140 formed on a rear surface of the photoconductor substrate 110.

The substrate 110 may be formed of a photoconductor. As used herein, "photoconductor" means a material having an insulation property in a dark or un-illuminated region, and having a conductive property only in a region where light is incident thereon. As used herein, "light" means electromagnetic radiation of any wavelength.

Thus, when light is projected onto the photoconductor substrate 110, only a region where light is incident is converted into a conductor, while a remaining region where light is not incident remains insulating. The photoconductor may be any appropriate material fulfilling the above definition, e.g., gallium arsenide (GaAs) or amorphous silicon (Si).

The insulating layer 120 may be formed of an anodized metal, e.g., alumina. Specifically, the insulating layer 120 may be formed by depositing an anodizable metal, e.g., aluminum, on a front surface of the photoconductor substrate 110 at a predetermined thickness and then anodizing the deposited metal.

The gate electrode layer 130 is formed on the insulating layer 120 and is formed of a conductive material, e.g., metal. More specifically, the gate electrode layer 130 may be formed of a metal selected from the group consisting of gold (Au), palladium (Pd), titanium (Ti) and aluminum (Al). Also, the gate electrode layer 130 may have a stepped structure, i.e., a pattern of alternating relatively thick and thin portions.

In general, the electron emission characteristic is sensitive to the material property and thickness of the gate electrode layer 130. As the thickness of the gate electrode layer 130 increases, the amount of the electrons that are transmitted by the gate electrode layer 130 and thus emitted from the gate electrode layer 130 abruptly decreases. Accordingly, the electrons are not readily emitted through the relatively thick portion of the gate electrode layer 130, but can be easily emitted through the relatively thin portion of the gate electrode layer 130. By the aforementioned characteristic, the pattern of the gate electrode layer 130 can be projected on the electron-resist 151 coated on a surface of the object substrate 150 to be processed.

The base electrode layer 140 is formed on the rear surface of the photoconductor substrate 110, and is formed of a transparent conductive material so that the light projected onto the emitter 100 can be transmitted to the photoconductor substrate 110. Of course, the base electrode layer 140 only needs to be transparent at the wavelength of the light being projected. As an example, if the light is in the visible region, the transparent conductive material may be indium tin oxide (ITO).

Next, an operating method of the emitter 100 for electron-beam projection lithography will be described.

Referring to FIG. 2, in the emitter 100 constructed as above, a gate voltage $V_G$ is applied between the base electrode layer 140 and the gate electrode layer 130 from a first power source 161. At this time, since the photoconductive substrate 110 has an insulation property, hot electrons are not generated by the emitter 100. However, if light, e.g., an ultraviolet or laser beam, is projected onto a portion (P) of the photoconductor substrate 110 from the rear side of the emitter 100, the portion (P) of the photoconductor substrate 110 where the light is projected is converted into a conductor. Thus, electrons start to be generated only in the portion (P).

Thus, hot electrons generated only in the portion (P) of the photoconductor substrate 110 are transmitted to the thin portion of the gate electrode layer 130 and are then emitted according to the electron emission characteristic depending on the thickness of the gate electrode layer 130. The hot electrons emitted from the emitter 100 may be accelerated by an acceleration voltage $V_A$ applied between the gate electrode layer 130 and an object substrate 150 to be processed, from a second power source 162, and collide with an electron-resist 151 coated on the surface of the object substrate 150.

As aforementioned, according to the emitter 100, by projecting light only onto on the portion (P) the photoconductor substrate 110, partial emission of electrons becomes possible. Thus, the electron-resist 151 coated on the object substrate 150 can be partially patterned. Accordingly, it becomes possible to partly correct and repair the electron-resist 151 after the allover first patterning of the electron-resist 151 or to only pattern select portions of the electron-resist 151. This allover first patterning may be achieved by providing light to the entire photoconductor substrate 110.

The light may be projected onto different portions of the emitter 100 at different times and/or may be projected to more than one portion of the emitter 100 at the same time, i.e., with resistive regions there between. The projection may be realized using an optical system to direct the light onto the emitter 100 and/or using a mask between the light source and the emitter 100. The wavelength and/or intensity of the light may be varied to further control the output of the emitter 100.

Hereinafter, a manufacturing method of the emitter for electron-beam projection lithography shown in FIG. 2 according to an embodiment of the present invention will be described step-by-step with reference to FIGS. 3 to 9.

Figure 3:
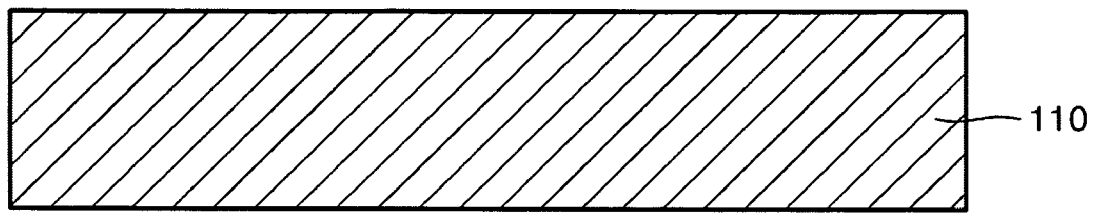
FIGS. 3 to 9 illustrate cross-sectional views of steps in a method of manufacturing the emitter for an electron-beam projection lithography system of FIG. 2, according to an embodiment of the present invention.

First, referring to FIG. 3, a photoconductor substrate 110 having a predetermined thickness is prepared. The photoconductor substrate 110 may be made of various known photoconductors, e.g., a gallium arsenide (GaAs) substrate or an amorphous silicon substrate, processed to have a predetermined thickness.

Figure 4:
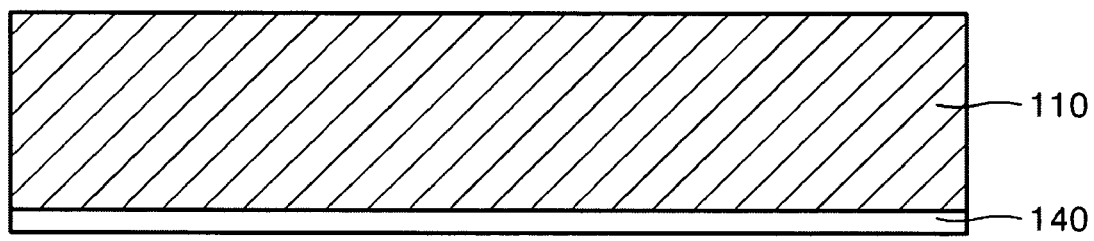

Next, as shown in FIG. 4, a base electrode layer 140 is formed on a rear surface of the photoconductor substrate 110. Specifically, the base electrode layer 140 may be formed by depositing a transparent conductive material, e.g., indium tin oxide (ITO), to a predetermined thickness. The forming of the base electrode layer 140 may be performed after forming an insulating layer 120 and a gate electrode layer 130 to be described later.

Figure 5:
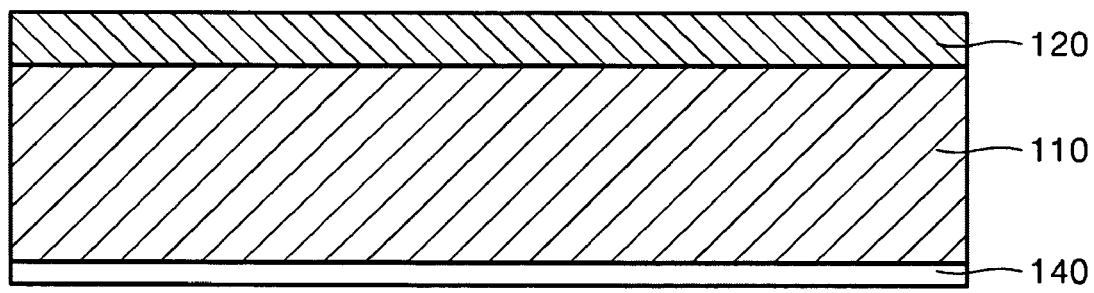

Next, as shown in FIG. 5, the insulating layer 120 is formed on a front surface of the photoconductor substrate 110. As an example, an anodizable metal, e.g., aluminum, is deposited at a predetermined thickness, and the deposited anodizable metal is anodized to form alumina ($Al_2O_3$). The depositing may be by a vacuum evaporation or sputtering. The alumina serves as the insulating layer 120.

FIGS. 6 to 9 show steps of forming a gate electrode layer 130 on the insulating layer 120.

Figure 6:
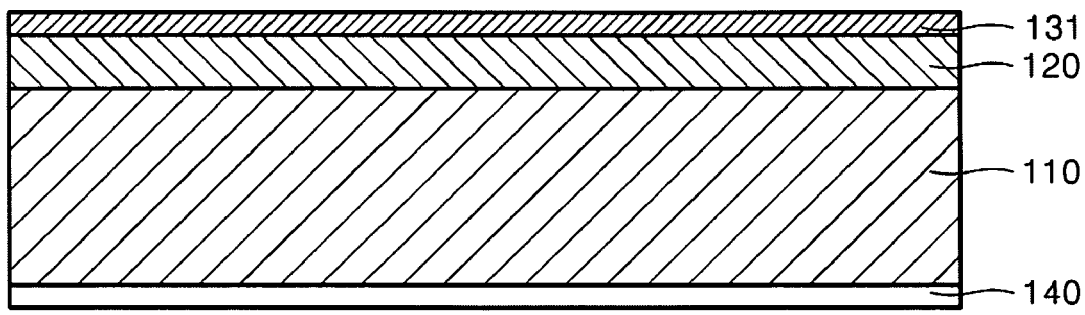

First, as shown in FIG. 6, a first conductor layer 131 is formed on the insulating layer 120. Specifically, the first conductor layer 131 may be formed by depositing a conductive material, e.g., gold (Au), palladium (Pd), titanium (Ti) or aluminum (Al), at a predetermined thickness on the insulating layer 120. The depositing may be by a vacuum evaporation or sputtering.

Figure 7:
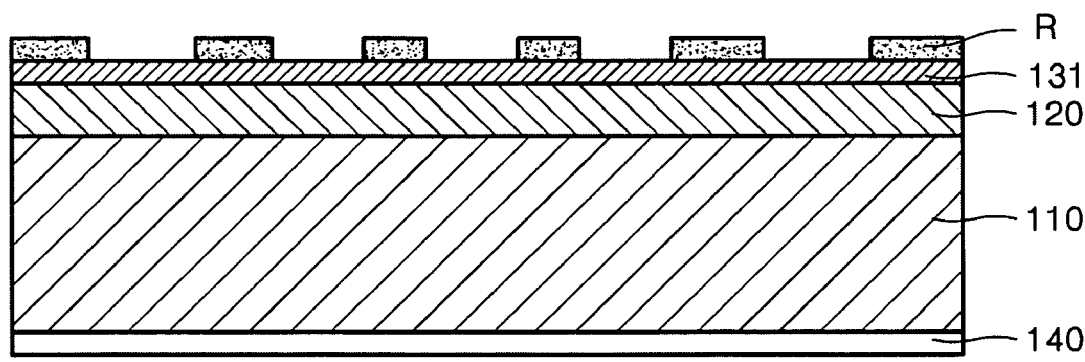

Next, as shown in FIG. 7, a resist (R) is formed on an entire surface of the first conductor layer 131 and is then patterned into a desired pattern. The patterning of the resist (R) may be performed by general lithography, e.g., photolithography or electron-beam projection lithography.

Figure 8:
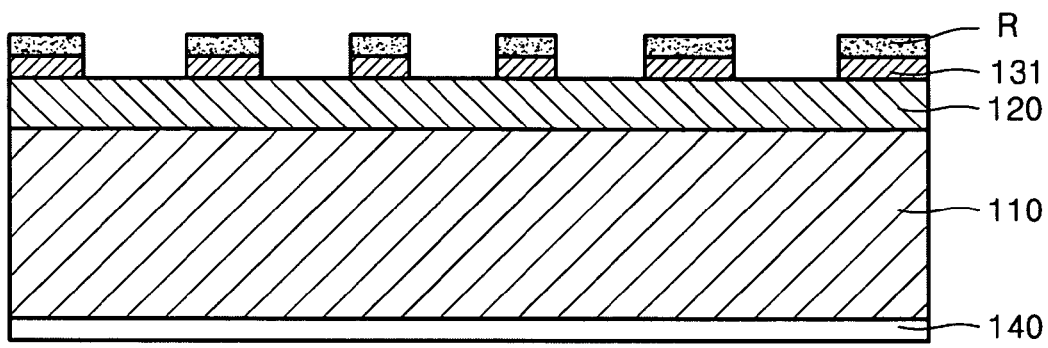
Figure 9:
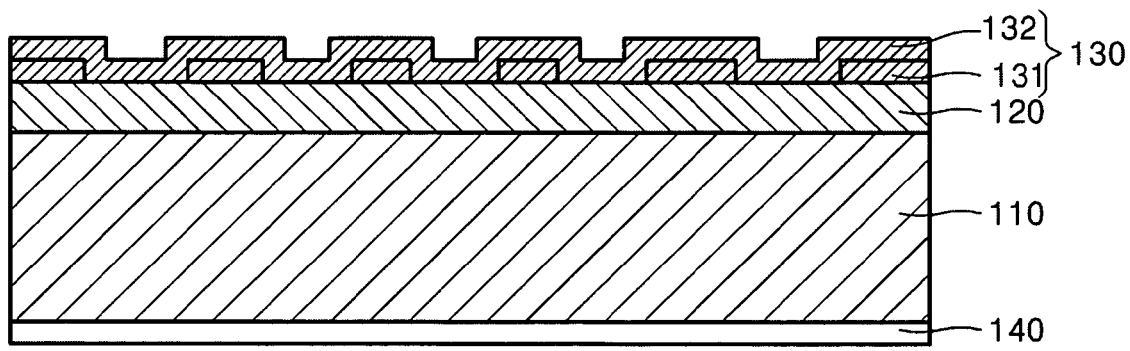

Next, as shown in FIG. 8, after the exposed portion of the first conductor layer 131 is etched and removed by using the patterned resist (R) as the etch mask, the patterned resist (R) is also removed.

Next, as shown in FIG. 9, by again depositing a conductive material, for instance, gold (Au), palladium (Pd), titanium (Ti) or aluminum (Al), at a predetermined thickness on an entire surface of the resultant of FIG. 8, a second conductor layer 132 is formed. Again, this depositing may be by a vacuum evaporation or sputtering, As a result, the gate electrode layer includes the first conductor layer 131 and the second conductor layer 132, which form a pattern having relatively thick and thin portions on the insulating layer 120.

As described previously, the emitter for an electron-beam projection lithography system according to the present invention can emit electrons from only portions thereof using a photoconductor substrate. This partial electron emission can be used to partially correct or repair an electron-resist to be patterned, e.g., after an allover first patterning. By shifting the location of the portion of the photoconductor being illuminated, this partial correction/repair may be shifted as well. More than one portion may be illuminated simultaneously.

While the present invention has been particularly shown and described with reference to exemplary embodiments thereof, it will be understood by those of ordinary skill in the art that various changes in form and details may be made therein without departing from the spirit and scope of the present invention as defined by the following claims. For instance, the insulating layer of the emitter, the gate electrode layer and the base electrode layer may be formed of materials not specifically mentioned herein. Also, since the stacking and forming method of each material are only given by way of example, a variety of depositing and etching methods may be employed. Further, the sequence of the respective operations in the manufacturing method of the emitter according to the present invention may be changed. Finally, the structure of the gate electrode layer may be as shown in the conventional art. Accordingly, it will be understood by those of ordinary skill in the art that various changes in form and details may be made without departing from the spirit and scope of the present invention as set forth in the following claims.

What is claimed is:

1. An emitter for an electron-beam projection lithography system, the emitter comprising:

a photoconductor substrate;

an insulating layer formed on a front surface of the photoconductor substrate;

a gate electrode layer formed on the insulating layer, wherein the gate electrode layer comprises an etched first conductor layer and a continuous second conductor layer; and a base electrode layer formed on a rear surface of the photoconductor substrate and formed of a transparent conductive material.

2. The emitter as claimed in claim 1, wherein the gate electrode layer comprises a pattern of alternating relatively thick and thin portions.

3. The emitter as claimed in claim 1, wherein the photoconductor substrate comprises at least one of a gallium arsenide substrate and an amorphous silicon substrate.

4. The emitter as claimed in claim 1, wherein the insulating layer is formed of an anodized metal.

5. The emitter as claimed in claim 4, wherein the insulating layer is formed of an anodized alumina.

6. The emitter as claimed in claim 1, wherein the gate electrode layer is formed of a metal selected from the group consisting of gold (Au), palladium (Pd), titanium (Ti) and aluminum (Al).

7. The emitter as claimed in claim 1, wherein the base electrode layer is formed of indium tin oxide.

8. A method of manufacturing an emitter for an electron-beam projection lithography system, the method comprising:

preparing a photoconductor substrate;

forming a base electrode layer on a rear surface of the photoconductor substrate, the base electrode layer being transparent;

forming an insulating layer on a front surface of the photoconductor substrate;

forming a gate electrode layer by depositing a first conductive material on the insulating layer to form a first conductor layer;

patterning the first conductor layer to form a predetermined conductor layer pattern; and depositing a second conductive material on the first conductor layer and the insulating layer exposed by the patterning step to form a continuous second conductor layer.

9. The method as claimed in claim 8, wherein the forming of the base electrode layer is performed after the forming of the gate electrode layer.

10. The method as claimed in claim 8, wherein the photoconductor substrate comprises at least one of a gallium arsenide substrate and an amorphous silicon substrate.

11. The method as claimed in claim 8, wherein the base electrode layer is formed of indium tin oxide.

12. The method as claimed in claim 8, wherein forming the insulating layer comprises:

depositing an anodizable metal on an entire surface of the photoconductor substrate; and anodizing the deposited metal.

13. The method as claimed in claim 12, wherein the metal is aluminum and alumina is formed by anodizing the aluminum.

14. The method as claimed in claim 8, wherein the gate electrode layer is formed of a metal selected from the group consisting of gold (Au), palladium (Pd), titanium (Ti) and aluminum (Al).

15. The method as claimed in claim 8, wherein forming the gate electrode layer further comprises patterning the first conductor layer and the second conductor layer so as to have a pattern of alternating relatively thick and thin portions.

16. The method as claimed in claim 8 wherein patterning the first conductor layer comprises:

coating a resist on an upper surface of the first conductor layer;

patterning the coated resist;

selectively etching the first conductor layer by using the patterned resist as an etch mask; and removing the resist.

* * * * *